(12) United States Patent
Kawato et al.

(10) Patent No.: US 6,483,244 B1
(45) Date of Patent: Nov. 19, 2002

(54) METHOD OF FAST START AND/OR FAST TERMINATION OF A RADIO FREQUENCY RESONATOR

(75) Inventors: Eizo Kawato, Kizucho (JP); Li Ding, Manchester (GB)

(73) Assignee: Shimadzu Research Laboratory (Europe) Ltd., Manchester (GB)

(*) Notice: Subject to any disclaimer, the term of this patent is extended or adjusted under 35 U.S.C. 154(b) by 0 days.

(21) Appl. No.: 09/868,751
(22) PCT Filed: Dec. 21, 1998
(86) PCT No.: PCT/GB98/03856
§ 371 (c)(1), (2), (4) Date: Jul. 31, 2001
(87) PCT Pub. No.: WO00/38312
PCT Pub. Date: Jun. 29, 2000
(51) Int. Cl.[7] ................................. H03B 5/12
(52) U.S. Cl. ..................... 315/39.51; 331/167
(58) Field of Search ............ 315/39.51; 324/318, 324/322; 331/165, 166, 167, 117 FE, 173

(56) References Cited

U.S. PATENT DOCUMENTS

| 2,939,952 | A | | 6/1960 | Paul et al. |
|---|---|---|---|---|
| 3,866,145 | A | | 2/1975 | Hess, Jr. et al. |
| 4,801,885 | A | * | 1/1989 | Meissner et al. ........... 324/318 |
| 4,833,427 | A | | 5/1989 | Leuthold et al. |
| 5,399,857 | A | | 3/1995 | Doroshenko et al. |
| 5,517,158 | A | | 5/1996 | Gabara |

FOREIGN PATENT DOCUMENTS

| WO | WO 99/39368 A2 | 8/1999 |
|---|---|---|
| WO | WO 99/39370 A1 | 8/1999 |

* cited by examiner

Primary Examiner—Don Wong
Assistant Examiner—James Clinger
(74) Attorney, Agent, or Firm—Leydig, Voit & Mayer, Ltd.

(57) ABSTRACT

A method of fast start and/or fast termination of a radio frequency resonator, which has a coil, a capacitor and two switches with internal resistance wherein one end of the switches is connected to a junction of the coil and the capacitor where a RF voltage is provided, and another end of each switch is connected to high voltage power supplies with opposite polarities, a fast start being achieved by closing one of the switches for a short period of time for fast start, and a fast termination being obtained by closing both switches for a while.

19 Claims, 2 Drawing Sheets

METHOD OF FAST START AND/OR FAST TERMINATION OF A RADIO FREQUENCY RESONATOR

FIELD OF THE INVENTION

The present invention relates to a radio frequency (RF) resonator and an apparatus using a RF resonator circuit. More specifically, the invention relates to an ion-trapping device namely a quadrupole ion trap.

BACKGROUND OF THE INVENTION

The quadrupole ion trap is initially described by Paul et al in U.S. Pat. No. 2,939,952 and normally consists of three electrodes; a ring electrode and two end-cap electrodes one on each side of the ring electrode. A radio frequency (RF) voltage is normally applied to the ring electrode, and two end-cap electrodes are normally grounded. A coil is connected to the ring electrode forming a LC resonator together with the capacitance between the ring electrode and the two end-cap electrodes as well as the capacitance of all other circuit elements connected to the ring electrode. Because of the high Q-value of the resonator, even a low voltage RF driver, which is connected to the coil directly or through transformer coupling, can effectively produce a high RF voltage on the ring electrode.

A quadrupole ion trap can be used as an ion-trapping device of mass analysis apparatus together with a variety of ion sources. One of the most popular ion sources is liquid chromatography with electrospray ionization. Another ion source, which seems a very promising combination with the ion trap, is matrix-assisted laser desorption/ionization (MALDI).

The ions produced by a MALDI ion source are inevitably pulsed and synchronized to the laser pulse. A trapping efficiency of those ions is maximized by using a method of fast start of RF voltage as described in UK Patent Application No.9802112.4. Unfortunately, an ordinary RF driver circuit provides only a low excitation voltage, and the rate of increase of RF voltage becomes quite low. The time to establish a required RF voltage usually requires several cycles of RF or more than that.

Another attempt was made using a quadrupole ion trap in conjunction with a time-of-flight mass spectrometer, which is described in the UK Patent Application No.9802111.6. In this method ion extraction voltages are applied to the two end-cap electrodes, and the RF voltage on the ring electrode should be terminated at the same time or nearly the same time of application of the extraction voltages. To prevent the ions escaping from the ion-trapping region, the termination should be fast enough, at least less than one cycle of the RF. Again, this is difficult to achieve using an ordinary RF driver circuit. While the excitation voltage of the RF driver circuit is terminated, the energy stored in the resonator is consumed and is released only via the resistance of the resonator, and the time constant of decay of the RF voltage is usually much more than one cycle of the RF.

It is an object of the invention to provide a method of fast start of the RF resonator and/or fast termination of the resonator to achieve a high efficiency of ion trapping from the MALDI ion source and/or effective extraction of the ions into a time-of-flight mass spectrometer.

SUMMARY OF THE INVENTION

Accordingly, the invention provides a method of fast start and/or fast termination of a radio frequency resonator, which has a coil, a capacitor means and two switch means each having an internal resistance, one end of each said switch means being connected to a junction of said coil and said capacitor means where a radio frequency voltage is provided, and another end of each said switch means being connected to high voltage power supplies having opposite polarities, the method comprising: closing one of said switch means for a short period of time for fast start of said radio frequency resonator, and/or closing both of said switch means for a time interval for fast termination of said radio frequency resonator.

In the MALDI ion source, ions are produced by a laser pulse directed at the sample surface, and are guided into an ion trap using ion optics built inside the MALDI ion source. Before ions are produced, the RF voltage applied on the ring electrode is zero. When the ions are inside the ion-trapping region surrounded by three electrodes, one of the switches is closed to charge the capacitance between the ring electrode and the end-cap electrodes, the capacitance due to additional circuitry, for example a measuring circuit of the RF voltage, and a stray capacitance. Once the capacitance is charged, the switch is opened immediately to initiate a free oscillation of the resonator. The excitation voltage of the RF driver circuit is also set to a proper voltage to sustain the oscillation, but timing is not so critical because the RF voltage does not change so rapidly with a lower excitation voltage of the RF driver circuit.

For extraction of ions into a time-of-flight mass spectrometer, the RF voltage is turned to zero by closing both switches at the same time. When the high voltage power supplies connected to the switches have the same voltage with opposite polarities and the switches have the same internal resistance the RF voltage applied between the two switches approaches to zero with a time constant determined by the capacitance between the electrodes and the resistance of the switches. This time constant can be set small enough to prevent the ions escaping from the ion-trapping region. The extraction voltages are also applied to the end-cap electrodes at nearly the same time as the RF termination for extracting ions into the time-of-flight mass spectrometer. The switches are kept closed until all the ions are extracted from the ion trap. Later, the switches are opened, without affecting ion motion. The excitation voltage of the RF driver circuit is also set to zero to prevent oscillation after ion extraction, but again timing is not so critical because the RF voltage is kept zero by the switches while ions are extracted.

BRIEF DESCRIPTION OF THE DRAWINGS

A method of fast start and/or fast termination of the resonator is now described, by way of example only, with reference to accompanying drawings in which.

DETAILED DESCRIPTION OF PREFERRED EMBODIMENTS

Figure 1:
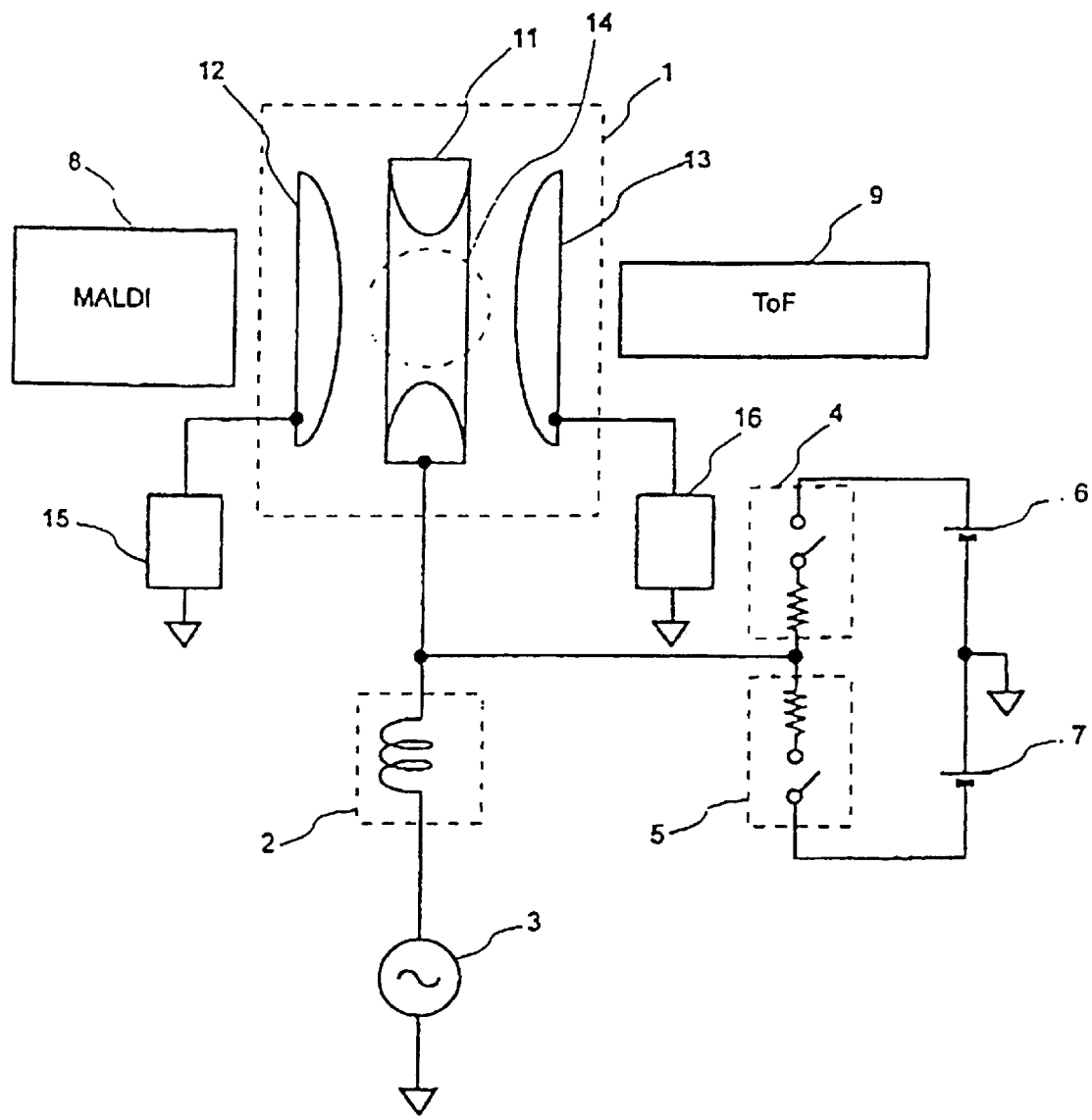
FIG. 1 is a schematic representation of a quadrupole ion trap with a MALDI ion source and a time-of-flight mass spectrometer.
Figure 2:
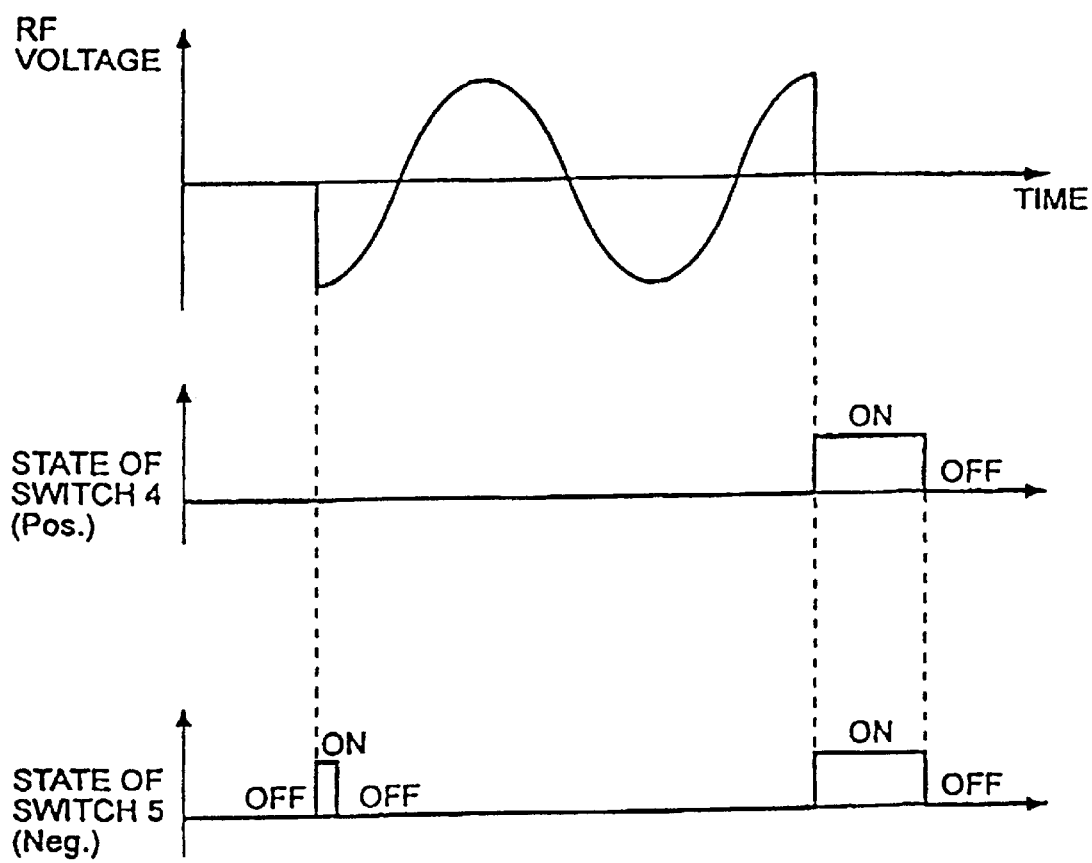
FIG. 2 is an explanatory timing diagram showing a RF voltage and states of two switches.

Referring to FIG. 1, a quadrupole ion trap 1 comprises a ring electrode 11 and two end-cap electrodes 12 and 13. These three electrodes form an ion-trapping region 14. The end-cap electrodes 12 and 13 are connected to the voltage sources 15 and 16, respectively, which provide extraction voltages and voltage waveforms used during ion trap operations. A coil 2 is connected to the ring electrode 11 and followed by a RF driver circuit 3. To the ring electrode 11, two switches 4 and 5 are also connected. On the other end of these two switches, two high voltage supplies 6 and 7 are connected, respectively. FIG. 2 illustrates the timing of switch operations as well as the RF voltage in the case of fast start of RF voltage to a negative polarity. In this case, switch 5 connected to the negative high-voltage supply 7 is turned on, (i.e. closed) at the beginning, to set the RF voltage to be the same as the voltage of the high voltage supply 7. Soon after, the switch 5 is turned off (i.e. opened) and the RF resonator will start to oscillate at its resonance frequency. In this example, fast termination of RF resonator is made at a positive peak of a RF voltage. At this moment, both switches 4 and 5 are turned on. Positive and negative voltages of the high voltage supplies 6 and 7 are divided according to the ratio of internal resistances of the switches 4 and 5. Because the voltage of high voltage supply 6 is the same as that of high voltage supply 7 and the internal resistance of the switch 4 is the same as that of the switch 5, the RF voltage becomes zero and is kept zero while both switches are kept on. After all ions have been extracted from the quadrupole ion trap, both switches 4 and 5 are turned off.

The RF driver circuit 3 is also operated to match the voltage determined by these switching operations. At fast start of the RF resonator, the RF driver circuit 3 is set to produce a peak voltage the same as the voltage of high voltage supply 7. Thus the oscillation initiated by switch operation can be sustained continuously by the RF driver circuit 3. At fast termination of the RF resonator the RF driver circuit 3 is set to zero and the RF voltage, set to zero by the switching operations, will be kept zero until the next sequence will start.

Although the aforementioned example shows one switch for each polarity, either or both of the switches can be composed of a set of switches. For example, the switch 4 or 5 can be a single power MOSFET device or a set of power MOSFET devices connected in series.

The RF driver circuit 3 is depicted with a direct connection to the coil 2, but the RF driver can be connected with transformer coupling to the coil 2.

In FIG. 2, the RF voltage is terminated after only 1.5 cycle for explanatory purpose only. Practically, the RF voltage is sustained for a much longer time to handle ions trapped inside the trapping region. Usually, the RF voltage is changed to shift a trapping condition before extraction will be made. Thus, a termination may start from a RF voltage different from the voltage of high voltage supply 6 and/or 7.

What is claimed is:

1. A method of fast start and/or fast termination of a radio frequency resonator, which has a coil, a capacitor means and two switch means each having an internal resistance, one end of each said switch means being connected to a junction of said coil and said capacitor means where a radio frequency voltage is provided, and another end of each said switch means being connected to high voltage power supplies having opposite polarities, the method comprising:

(a) closing one of said switch means for a short period of time for fast start of said radio frequency resonator, and/or
    (b) closing both of said switch means for a time interval for fast termination of said radio frequency resonator.

2. A method as set forth in claim 1, wherein said radio frequency resonator is built in an ion-trapping device.

3. A method as set forth in claim 2, wherein said ion-trapping device is a quadrupole ion trap.

4. A method as set forth in claim 3, wherein said quadrupole ion trap is associated with a MALDI ion source and/or a time-of-flight mass spectrometer.

5. A method as set forth in claim 1, wherein said switch means having an internal resistance can be either a switching device or a set of switching devices connected in series.

6. A method as set forth in claim 5, wherein said switching device is a power MOSFET with a proper gate driver circuit.

7. A method as set forth in claim 5, wherein said internal resistance consists of the internal resistance of said switching device and, optionally, the resistance of at least one external resistor connected to said switching device(s) in series.

8. A method as set forth in claim 1, wherein said internal resistance is the same for both said switch means, and voltage provided by said high voltage power supplies is the same with opposite polarities.

9. A method as set forth in claim 1, wherein said capacitor means consists of the capacitance between a ring electrode and end-cap electrodes, the capacitance due to additional circuit.

10. An apparatus having a radio frequency resonator, comprising a coil, a capacitor means and two switch means each having an internal resistance, one end of each said switch means being connected to a junction of said coil and said capacitor means where a radio frequency voltage is provided, and another end of each said switch means is connected to high voltage power supplies having opposite polarities, and said switch means being operated by a method comprising:

(a) closing one of said switches for a short period of time for fast start of said radio frequency resonator, and/or
    (b) closing both of said switches for a time interval for fast termination of said radio frequency resonator.

11. An apparatus as set forth in claim 10, wherein said apparatus is an ion-trapping device.

12. An apparatus as set forth in claim 11, wherein said ion-trapping device is a quadrupole ion trap.

13. An apparatus as set forth in claim 12, wherein said quadrupole ion trap is associated with a MALDI ion source and/or a time-of-flight mass spectrometer.

14. An apparatus as set forth in claim 10, wherein said switch means having an internal resistance can be either a switching device or a set of switching devices connected in series.

15. An apparatus as set forth in claim 14, wherein said switching device is a power MOSFET with a proper gate driver circuit.

16. An apparatus as set forth in claim 14, wherein said internal resistance consists of the internal resistance of said switching device and, optionally, the resistance of at least one external resistor connected to said switching device(s) in series.

17. An apparatus as set forth in claim 10, wherein said internal resistance is the same for both said switch means and voltage provided by said high voltage power supplies is the same with opposite polarities.

18. An apparatus as set forth in claims 10, wherein said capacitor means consists of the capacitance between a ring electrode and end-cap electrodes, the capacitance due to additional circuitry, for example a measuring circuit of the RE voltage, and a stray capacitance.

19. An apparatus including a radio frequency resonator, comprising capacitor means, a coil coupled to the capacitor means and first and second switch means each having an internal resistance, wherein a radio frequency voltage is applied to a junction of the coil and the capacitor means, one end of each said switch means is connected to the junction, another end of each said switch means is coupled to a source of high voltage for supplying to the first and second switch means respective high voltages of opposite polarity, one or another of said switch means being operable for fast start of said radio frequency resonator and/or both of said switch means being simultaneously operable for fast termination of said radio frequency resonator.

* * * * *